United States Patent [19]

Scribner

[11] Patent Number: 5,345,668
[45] Date of Patent: Sep. 13, 1994

[54] METHOD FOR DETECTING MIS-ORIENTATION OF SEMICONDUCTOR PACKAGES

[75] Inventor: Cliff J. Scribner, Phoenix, Ariz.
[73] Assignee: Motorola, Inc., Schaumburg, Ill.
[21] Appl. No.: 996,746
[22] Filed: Dec. 24, 1992
[51] Int. Cl.$^5$ .................... H01L 21/02; B65G 47/74
[52] U.S. Cl. ........................................ 29/593; 29/407
[58] Field of Search ............... 29/407, 593, 705, 759, 29/760, 832–835; 73/1 E, 52, 865.8; 174/52.2, 52.3, 52.4; 324/158 F

[56] References Cited

U.S. PATENT DOCUMENTS

| | | | |
|---|---|---|---|
| 3,559,054 | 1/1971 | Bowers | 29/593 |
| 3,808,752 | 5/1974 | Beaver et al. | 29/593 X |
| 4,801,561 | 1/1989 | Sankhagomit | 174/52.4 X |
| 4,953,283 | 9/1990 | Kawabata et al. | 29/759 X |
| 4,973,948 | 11/1990 | Roberts | 324/158 F X |

FOREIGN PATENT DOCUMENTS

| | | | |
|---|---|---|---|
| 4137743 | 5/1992 | Japan | 29/593 |
| 4223353 | 8/1992 | Japan | 29/593 |

OTHER PUBLICATIONS

Makosch "Testing Method" IBM Technical Disclosure Bulletin vol. 15, No. 6, Nov. 1972, pp. 1830–1831.

*Primary Examiner*—Peter Dungba Vo
*Attorney, Agent, or Firm*—Rennie William Dover

[57] ABSTRACT

A method for detecting orientation of a semiconductor package (11) having a cavity (19) formed in a lower surface is described. The semiconductor package (11) is positioned in a travel path (24) of a packaging process apparatus (23). An orientation support plate (17) is provided having a protrusion (18) that is designed to fit into the cavity (19) in the semiconductor package (11). The orientation support plate (17) is moved towards the semiconductor package and the protrusion (18) fits into the cavity (19) when the semiconductor package (11) is properly oriented, and the protrusion kicks the semiconductor package (11) out of the travel path (24) when the semiconductor package (11) is mis-oriented.

11 Claims, 2 Drawing Sheets

METHOD FOR DETECTING MIS-ORIENTATION OF SEMICONDUCTOR PACKAGES

BACKGROUND OF THE INVENTION

The present invention relates, in general, to semiconductor package handling and, more particularly, to an apparatus and method for detecting the physical orientation of semiconductor packages.

Semiconductor devices and integrated circuits are usually mounted on a die support, electrically connected to conductive leads, and enclosed in a package comprising metal, ceramic, plastic, or the like. The packaged device is then marked to identify the particular type of device enclosed in the package. The packaging process is relatively expensive, often accounting for a surprisingly large percentage of the final cost of the device or integrated circuit. Thus, cost reduction and yield improvement present continuing challenges to semiconductor manufacturers.

Manufacturers require a high degree of automation in all packaging processes to reduce costs. One problem with highly automated processing is that parts are damaged and mis-processed when they are mis-oriented during a particular stage of the packaging or marking processes. For example, when a packaged device is trimmed to electrically separate the conductive leads which extend from the package, mis-orientation results in lead damage that cannot be repaired. In many instances, package mis-orientation results in extensive damage to automated tooling as well. Likewise, when a packaged device is marked, a mis-oriented device is marked incorrectly and must be reworked or scrapped. A need exists for a reliable method for detecting the orientation of semiconductor packages during specific automated assembly operations.

One method for controlling orientation uses machine vision to detect and analyze orientation of the packaged device. Machine vision, however, is very expensive, bulky, and slow. As a result, machine vision is usually reserved for final inspection operations and critical process steps. A less expensive alternative is to use optical sensors that detect and analyze light reflected from a package in an attempt to identify a distinctive signal that corresponds to correct orientation. Although optical sensors are widely used, they require frequent electrical adjustment and provide limited accuracy. As a result, yield losses due to mis-orientation are typically five to ten percent using only optical sensors to detect mis-orientation.

What is needed is an apparatus and method for detecting orientation of semiconductor packages that is highly accurate, fast, and inexpensive. Moreover, an apparatus and method for detecting physical orientation is needed that can be integrated with existing semiconductor package handling equipment, requires little or no adjustment during operation, and is easy to change over for machines that process several different types of packages.

SUMMARY OF THE INVENTION

Briefly stated, the advantages of the present invention are achieved by providing a semiconductor package having a cavity formed in a lower surface. The semiconductor package is positioned in a travel path of a packaging process apparatus. An orientation support plate is provided having a protrusion on an upper surface. The protrusion is designed to fit into the cavity in the semiconductor package. The semiconductor package is positioned so that the upper surface of the orientation support plate faces the lower surface of the semiconductor package. The orientation support plate is moved towards the semiconductor package. The protrusion moves into the cavity when the semiconductor package is properly oriented, and the protrusion kicks the semiconductor package out of the travel path when the semiconductor package is mis-oriented.

DETAILED DESCRIPTION OF THE DRAWINGS

Figure 1:
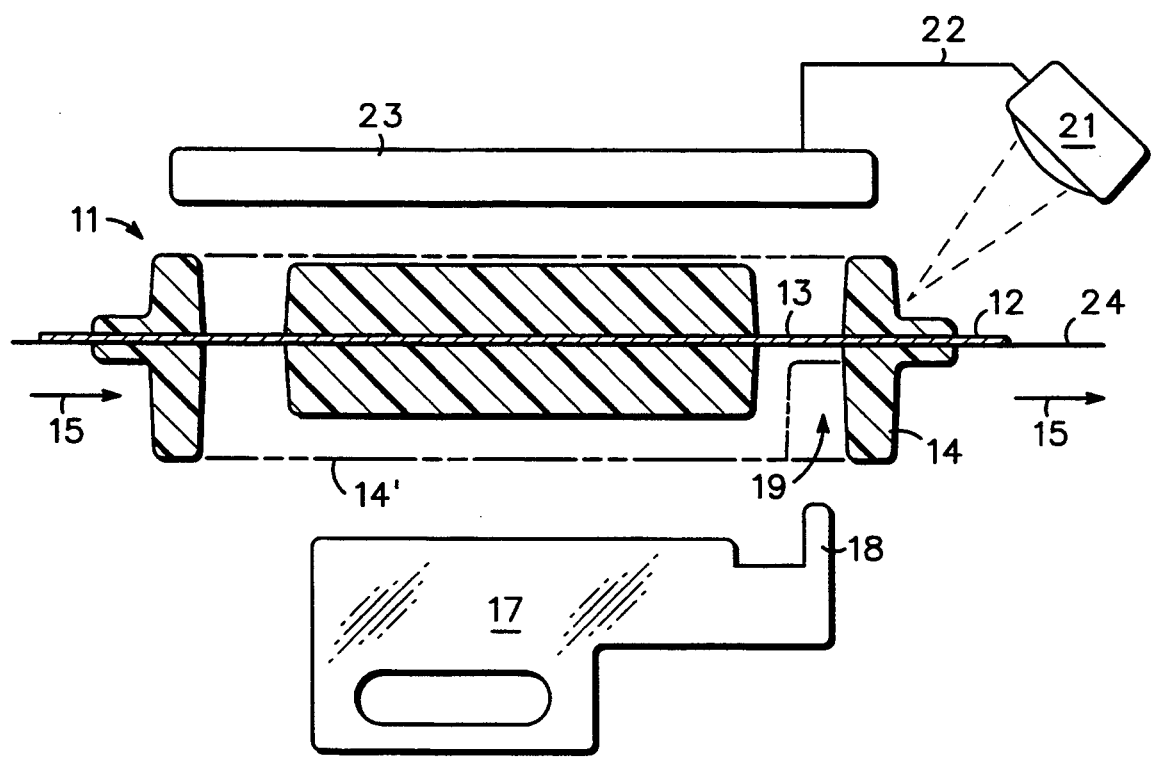
FIG. 1 illustrates a cross-section of a package processing tool using the method in accordance with the present invention.
Figure 2:
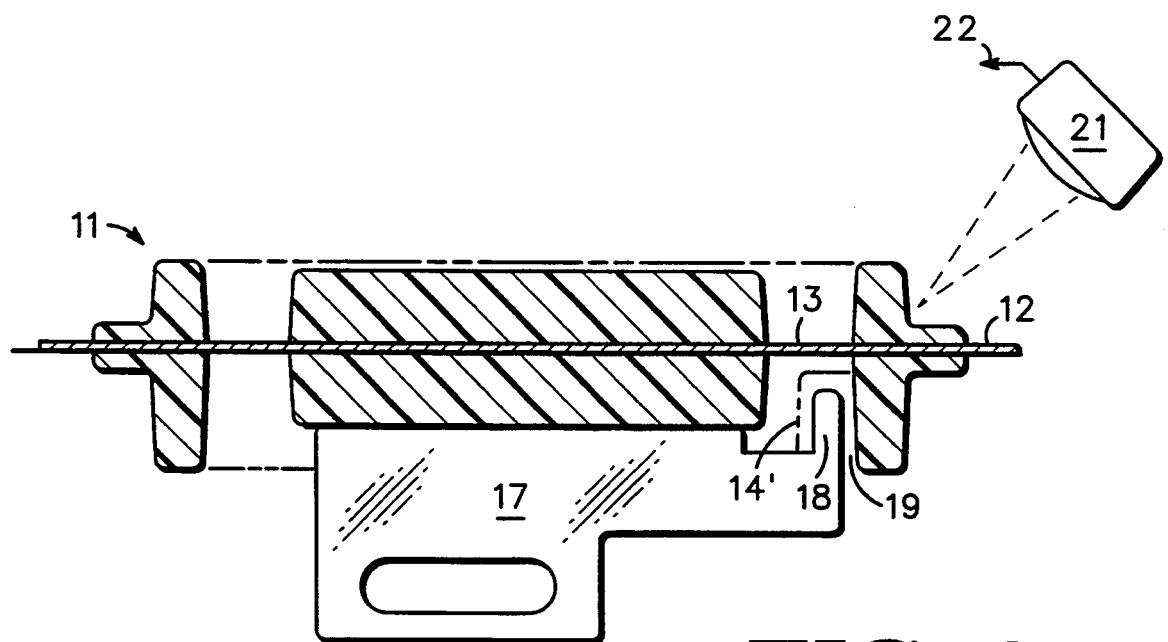
FIG. 2 illustrates a cross-sectional view of the tool shown in FIG. 1 processing a properly oriented semiconductor package.
Figure 3:
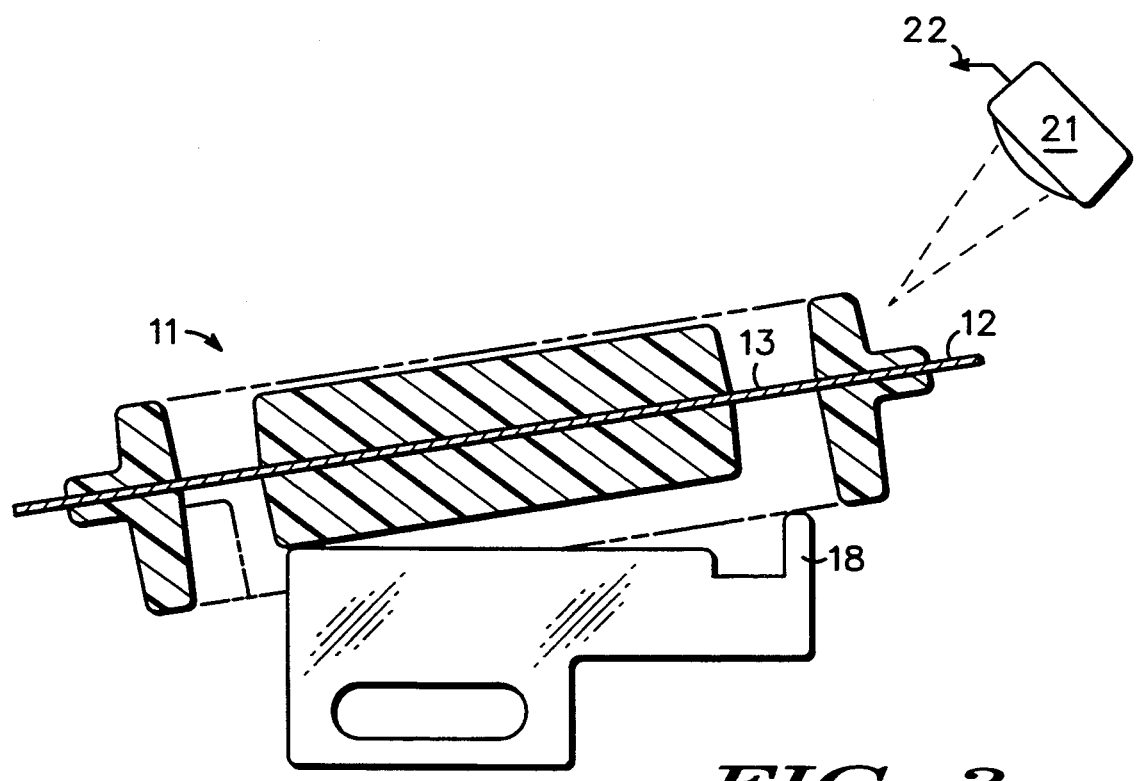
FIG. 3 illustrates a cross-sectional view of the tool shown in FIG. 1 processing a mis-oriented semiconductor package.

FIG. 1 illustrates essential elements of the apparatus in accordance with the present invention, while FIG. 2 and FIG. 3 are useful in understanding the method in accordance with the present invention. The apparatus and method in accordance with the present invention are described in terms of a plastic-encapsulated semiconductor package 11 known as a "quad flat pack" or "QFP" package in the semiconductor industry. A semiconductor device or integrated circuit chip (not shown) is mounted on leadframe 12 inside semiconductor package 11. Plastic encapsulation material is molded around leadframe 12 in a predetermined shape to form semiconductor package 11. Leads 13 extend from semiconductor package 11 and allow electrical connection to the integrated circuit chip.

A molded carrier ring (MCR) 14 is desirably formed as an annular region of semiconductor package 11 to support leads 13 during package processing. Not all plastic semiconductor packages use a MCR 14, and the method and apparatus of the present invention can be easily adapted to packages without MCR 14. Moreover, the apparatus and method of the present invention are easily adaptable to semiconductor packages comprising metal, ceramic, or the like.

Semiconductor package 11, attached to leadframe 12, is illustrated traveling in the direction of the arrows 15 in FIG. 1. Semiconductor package 11 is traveling on track 24 of a package processing apparatus 23. Track 24 includes any type of known handling tools, such as belts, rollers, or similar travel mechanisms that move packages or leadframes through a package processing tool. Package processing apparatus 23 can be any type of tool that performs operations on a packaged semiconductor device, such as a pad print marker, laser marker, a trimming tool for cutting portions of leadframe 12, a leadform tool for shaping leads 13, or an electronic tester for making electrical connection to leads 13.

Molded carrier ring 14 is a part of semiconductor package 11 that is discarded before semiconductor package 11 is finally mounted in a finished product. Because of this, MCR 14 may be referred to as a "waste" portion of semiconductor package 11. Portions of MCR 14 that are in back of the plane of the cross-section shown in FIG. 1 are illustrated in phantom and labeled 14'. A cavity 19 is formed in a lower surface of one side of semiconductor package 11.

Another feature of the apparatus in accordance with the present invention is orientation support plate 17. Orientation support plate 17 serves to provide mechanical support to semiconductor package 11 during package processing. For example, when package processing apparatus 23 is a pad print marker, orientation support plate 17 moves upward to contact and support semiconductor package 11 when pressure is applied to the upper surface of semiconductor package 11 during the marking process.

An important feature of orientation support plate 17 is protrusion 18 which extends upward from the upper surface of orientation support plate 17. Protrusion 18 is shaped to fit loosely into cavity 19 when orientation support plate is in its upper position (shown in FIG. 2).

Also shown in FIG. 1 is proximity sensor 21 which may comprise a reflective optical sensor, transmission optical sensor, or any of a number of known proximity sensor designs. Proximity sensor 21 is placed at a predetermined fixed location from travel path 24 and includes an output 22 that generates a first signal when semiconductor package 11 is in travel path 24. Proximity sensor 21 also generates a second signal on output 22 when semiconductor package 11 is not in travel path 24. Output 22 is coupled to package processing apparatus 23 and deactivates package processing apparatus 23 whenever the second signal is present on output 22. This arrangement prevents mis-processing of semiconductor package 11 if it is not properly located in travel path 24.

FIG. 2 and FIG. 3 together illustrate important features of the method in accordance with the present invention. Semiconductor package 11 is positioned in travel path 24 and moved into alignment with package processing apparatus 23 (shown in FIG. 1) and orientation support plate 17. The upper surface of orientation support plate 17 faces the lower surface of semiconductor package 11. Orientation support plate 17 is then moved upwards to contact the lower surface of semiconductor package 11. Although protrusion 18 extends above the lower surface of semiconductor package 11, when semiconductor package 11 is properly oriented protrusion 18 fits loosely into cavity 19, allowing orientation support plate 17 to provide mechanical support for semiconductor package 11 without disturbing the location of semiconductor package 11 in travel path 24. Thus, when semiconductor package 11 is properly oriented, proximity sensor 21 generates the first output signal on output 22, and package processing apparatus 23 (shown in FIG. 1) can be activated.

However, when semiconductor package 11 is mis-oriented, as shown in FIG. 3, protrusion 18 contacts semiconductor package 11 and kicks a portion of the package off of travel path 24, i.e., protrusion 18 contacts semiconductor package 11 and moves a portion of semiconductor package 11 out of travel path 24 when semiconductor package 11 is mis-oriented. In this case, proximity sensor 21 detects the change in position of semiconductor package 11, and produces the second output signal on output 22. When the second output signal appears on output 22, package processing apparatus 23 (shown in FIG. 1) is disabled, and semiconductor package 11 is protected from mis-processing.

It should be noted that orientation support plate 17 together with proximity sensor 21 are very inexpensive and typically durable modifications of a conventional package processing apparatus. The inventor of the present invention has found that proximity sensor 21 requires no adjustment or maintenance when compared with multiple reflective sensors used in previous equipment. Moreover, the method in accordance with the present invention is easily adapted to almost any package type by providing a cavity 19 in the package. Protrusion 18 of orientation support plate 17 is shaped and aligned to cavity 19 in the package, or to a cavity that already exists in the package design.

By now it should be appreciated that an apparatus and method for detecting mis-orientation of semiconductor packages is provided. Through inexpensive mechanical modification of existing package processing equipment, a rugged and reliable means to prevent yield loss and quality reduction caused by mis-processing of semiconductor packages is provided. Because of the highly reliable detection of package mis-orientation, the packaging process can be further automated, resulting in lower packaging costs for manufacturers, and lower device costs for end customers.

I claim:

1. A method for detecting mis-orientation of a semiconductor package comprising the steps of:

providing the semiconductor package, wherein the semiconductor package has a lower surface and a cavity extending a first distance into the semiconductor package from the lower surface, and the semiconductor package is positioned in a travel path of a packaging process apparatus;

providing an orientation support plate having a protrusion on an upper surface, wherein the protrusion is for mating with the cavity in the semiconductor package;

positioning the semiconductor package so that the upper surface of the orientation support plate faces the lower surface of the semiconductor package; and moving the orientation support plate towards the semiconductor package, wherein the protrusion mates with the cavity and extends into the cavity at most a distance equal to the first distance when the semiconductor package is properly oriented, and the protrusion contacts the semiconductor package and moves a portion of the semiconductor package out of the travel path when the semiconductor package is mis-oriented.

2. The method of claim 1 further comprising the steps of:

providing a proximity sensor at a predetermined distance from the semiconductor package, wherein the proximity sensor has an output;

generating a first output signal on the output of the proximity sensor, wherein the first output signal indicates when the semiconductor package is properly oriented on the travel path; and generating a second output signal on the output of the proximity sensor, wherein the second output signal indicates when the portion of the semiconductor package is moved out of the travel path when the semiconductor package is mis-oriented.

3. The method of claim 1 wherein the cavity is formed in a waste portion of the semiconductor package.

4. The method of claim 2, including providing a pad print marker as the packaging process apparatus, and further including marking the semiconductor package using the pad print marker when the first output signal is present on the output of the proximity sensor.

5. The method of claim 2, including providing a lead trim tool as the packaging process apparatus, and further including trimming waste portions of leads of the semiconductor package using the lead trim tool when the first output signal is present on the output of the proximity sensor.

6. The method of claim 2, including providing a leadform tool as the packaging process apparatus, and further including forming the leads of the semiconductor package using the leadforming tool when the first output signal is present on the output of the proximity sensor.

7. A method for detecting mis-orientation in a semiconductor package, comprising the steps of:

providing a semiconductor package having a waste portion that is discarded during package processing, wherein the waste portion has a lower surface and a cavity extending from the lower surface into the waste portion of the semiconductor package;

positioning the semiconductor package in a travel path of a packaging process apparatus;

providing an orientation support plate having an upper surface facing the lower surface of the waste portion of the semiconductor package;

providing a protrusion extending upward from the upper surface of the orientation support plate, the protrusion is for mating with the cavity in the semiconductor package;

moving the orientation support plate towards the travel path so that the protrusion extends above the lower surface of the waste portion of the semiconductor package when the protrusion mates with the cavity and the semiconductor package is properly oriented on the travel path, and the protrusion contacts the waste portion when the semiconductor package is mis-oriented on the travel path, the semiconductor package remaining in the travel path when the semiconductor package is properly oriented and a portion of the semiconductor package being moved off the travel path when the semiconductor package is mis-oriented.

8. The method of claim 7, further including a step of marking a non-waste portion of the semiconductor package when the semiconductor package is properly oriented on the travel path and the protrusion is mated with the cavity in the semiconductor package.

9. The method of claim 8, further including providing a pad print marker as the packaging process apparatus, wherein the pad print marker performs the step of marking a non-waste portion of the semiconductor package.

10. The method of claim 7, further including a step of trimming the waste portion of the semiconductor package from a non-waste portion of the semiconductor package when the semiconductor package is properly oriented on the travel path and the protrusion is mated with the cavity in the semiconductor package.

11. The method of claim 7, further including a step of shaping the leads when the semiconductor package is properly oriented on the travel path and the protrusion is mated with the cavity in the semiconductor package.

* * * * *